(12) United States Patent
Schaefer et al.

(10) Patent No.: US 7,205,226 B1
(45) Date of Patent: Apr. 17, 2007

(54) SACRIFICIAL LAYER FOR PROTECTION DURING TRENCH ETCH

(75) Inventors: David Schaefer, Vancouver, WA (US); Robert Charatan, Portland, OR (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 11/138,848

(22) Filed: May 25, 2005

Related U.S. Application Data (60) Provisional application No. 60/656,785, filed on Feb. 24, 2005.

(51) Int. Cl.
*H01L 21/4763* (2006.01)

(52) U.S. Cl. ............ 438/637; 438/687; 438/627; 438/700; 438/710; 257/E21.017

(58) Field of Classification Search .......... 438/637, 438/687, 627, 700, 710
See application file for complete search history.

(56) References Cited

U.S. PATENT DOCUMENTS

| 2002/0096727 A1* | 7/2002 | Fischer et al. ............ 257/415 |
| 2003/0216036 A1* | 11/2003 | Ma ............................ 438/637 |
| 2005/0191806 A1* | 9/2005 | Gutsche et al. ............ 438/243 |

* cited by examiner

*Primary Examiner*—Asok K. Sarkar
*Assistant Examiner*—Victor V. Yevsikov
(74) *Attorney, Agent, or Firm*—Martine Penilla & Gencarella, LLP (57) ABSTRACT

A method for etching a trench is provided. The method initiates with providing a substrate having a patterned feature. The method includes alternating between deposition of a protective layer onto inner surfaces of the patterned feature and etching the trench into the substrate. The alternating may be achieved through a gas modulation technique and in one embodiment, the deposition and the etching are performed in the same chamber, i.e., the substrate does not move to a different chamber between the etch and deposition processes. The alternating is continued until the trench is completed and then the trench is filled. A semiconductor processing system is also provided.

15 Claims, 6 Drawing Sheets

SACRIFICIAL LAYER FOR PROTECTION DURING TRENCH ETCH

CROSS REFERENCE TO RELATED APPLICATIONS

This application claims priority from U.S. Provisional Patent Application No. 60/656,785, filed on Feb. 24, 2005 and entitled "SACRIFICIAL LAYER FOR PROTECTION DURING DEEP SILICON TRENCH ETCH," which is incorporated herein by reference in its entirety for all purposes.

BACKGROUND OF THE INVENTION

During the manufacturing of semiconductor-based devices, it is common to etch features, such as a trench, into a substrate. One exemplary film stack employed when etching a trench into a silicon substrate includes a mask composed of a thick silicon dioxide layer on top of a second thin layer, e.g., a silicon nitride layer, which is disposed over the silicon substrate. The silicon nitride layer is typically present as either an etch stop for subsequent CMP applications or as a stress relief for the underlying silicon layer. In addition, a photoresist layer may or may not be disposed on top of the silicon dioxide layer: Dry etch plasma reactors utilizing inductive coupled plasma technology (ICP) designed for silicon etch applications are limited in performing the silicon trench etch. This limitation is due to the thin layer, i.e., the silicon nitride layer, being laterally etched during the etch process. The etching of the thin layer may proceed laterally into the exposed portion of the silicon nitride layer around the trench opening. Though the lateral etching is small relative to the depth of the feature etched, e.g., the trench depth may be 20 microns deep, the lateral etching is significant enough so as to possibly cause voiding during subsequent gap filling of the trench. This voiding can eventually lead to device failure due to the stresses experienced in the vicinity of the void.

In view of the foregoing, there is a need for a method and apparatus that provides for the avoidance of the lateral etching of the thin layer disposed over the substrate into which a feature is being etched.

SUMMARY OF THE INVENTION

Broadly speaking, the present invention fills these needs by providing a method and apparatus for substantially eliminating the voids caused by lateral etching during the etch process without significantly affecting throughput. It should be appreciated that the present invention can be implemented in numerous ways, including as a method, a system, or an apparatus. Several inventive embodiments of the present invention are described below.

In one embodiment, a method for performing an etch operation on a substrate is provided. The method initiates with providing a substrate having an interface layer deposited thereon. Then, the interface layer is patterned to define an opening to a top surface of the substrate. A protective layer is deposited on the inner surfaces of the opening. A portion of the protective layer deposited on a horizontal inner surface of the opening is subsequently removed. Thereafter, a trench is etched into the substrate and the etched trench is filled.

In another embodiment, a method for etching a trench is provided. The method initiates with providing a substrate having a patterned feature. The method includes alternating between deposition of a protective layer onto inner surfaces of the patterned feature and etching the trench into the substrate. The alternating may be achieved through a gas modulation technique and in one embodiment, the deposition and the etching are performed in the same chamber. That is, the substrate does not move to a different chamber between the etch and deposition processes. The alternating between deposition and etching is continued until the trench is completed and then the trench is filled.

In yet another embodiment, a processing system for etching a substrate is provided. The processing system includes a processing chamber configured to support a substrate therein, the processing chamber includes a gas inlet for introducing process gasses and a radio frequency (RF) coil for creating a plasma from the process gasses. The processing system further includes a manifold system for delivering the process gasses to the processing chamber. A controller configured to alternate the introduction of the process gasses into the chamber through the manifold system is provided. The process gases alternate between deposition based gases and etch based gases. Thus, the controller enables a deposition process and an etch process to occur successively in the processing chamber by modulating gasses being introduced into the processing chamber.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, and like reference numerals designate like structural elements.

DETAILED DESCRIPTION OF THE PREFERRED EMBODIMENTS

An invention is described for a system and method for defining a trench within a substrate in a manner that avoids the lateral etching of a thin layer disposed over the surface of the substrate being etched. It will be obvious, however, to one skilled in the art, that the present invention may be practiced without some or all of these specific details. In other instances, well known process operations have not been described in detail in order not to unnecessarily obscure the present invention.

The embodiments of the present invention provide a system and method for etching a substrate in a manner that prevents the lateral etching of a thin stop layer disposed on the substrate being etched. In one embodiment, a gas modulation technique is utilized to alternate between a deposition phase and an etch phase in a processing chamber to incrementally etch the feature in a single processing chamber. The deposition phase defines a protection layer that prevents the lateral attack of a thin layer deposited over a substrate. In another embodiment, a hard mask and a protection layer may be deposited in a first processing chamber, while the feature is etched in a second processing chamber. The protection layer may be a carbon-based film or an oxide-based layer and may or may not be removed upon completion of the etching process of the feature as described further below.

Figure 1:
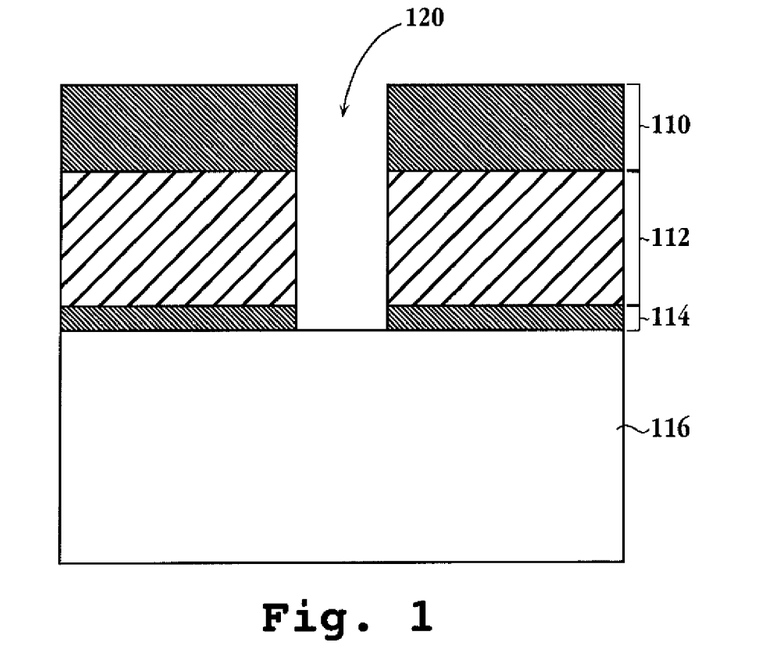
FIG. 1 is a simplified schematic diagram illustrating a cross-sectional view of an incoming substrate having an open hard mask in accordance with one embodiment of the invention.

FIG. 1 is a simplified schematic diagram illustrating a cross-sectional view of an incoming substrate having an open hard mask in accordance with one embodiment of the invention. Substrate 116 has a number of layers disposed thereon and is a silicon substrate in one embodiment. Silicon nitride layer 114 is disposed over substrate 116. Silicon dioxide layer 112 is disposed over silicon nitride layer 114. Photoresist layer 110 is disposed over silicon dioxide layer 112. The hard mask, which includes layers 112 and 114, and photoresist layer 110 have been patterned in order to define opening 120, which will be used eventually to etch a trench into substrate 116. As used herein, silicon dioxide layer 112 and silicon nitride layer 114 may be referred to as an interface layer, as well as a hard mask. One skilled in the art will appreciate that other suitable semiconductor materials may be used in place of silicon dioxide layer 112, silicon nitride layer 114, and silicon substrate 116. Thus, the composition of the layers may be considered exemplary as other suitable materials may be utilized with the techniques described herein. For example, an amorphous carbon material, Titanium nitride or Tantalum nitride may be used in place of silicon dioxide and silicon oxynitride may be used in place of silicon nitride. It should be appreciated that any suitable hard refractive metal may be used for layer 112. In one embodiment of the invention, the opening 120 may proceed slightly into silicon substrate 116, i.e., past the bottom surface of layer 114. In another exemplary embodiment, opening 120 may proceed about up to 300 angstroms into a top surface of silicon substrate 116.

Figure 2:
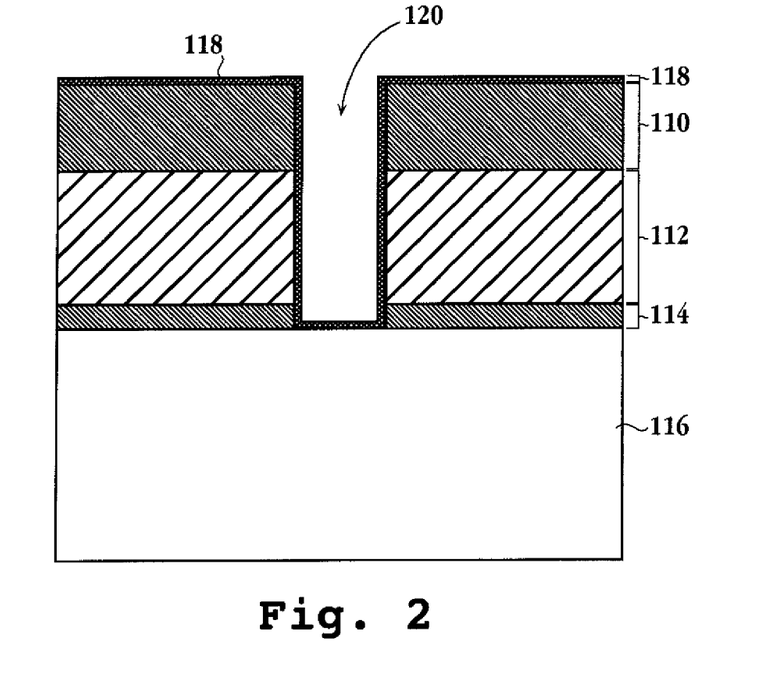
FIG. 2 is a simplified schematic diagram illustrating a cross-sectional view of a sacrificial layer deposited on the incoming substrate of FIG. 1, in accordance with one embodiment of the invention.

FIG. 2 is a simplified schematic diagram illustrating a cross-sectional view of a sacrificial layer deposited on the incoming substrate of FIG. 1, in accordance with one embodiment of the invention. As illustrated, silicon substrate 116 has the corresponding stack of layers of silicon nitride 114, silicon dioxide 112, and photoresist 110 disposed thereon. Layer 118, which may also be referred to as a sacrificial layer or protection layer, is disposed over photoresist 110 and along the inner surfaces of opening 120. Sacrificial layer 118 is deposited to protect silicon nitride layer 114 from the lateral attack during a deep silicon trench etch. In one embodiment, sacrificial layer 118 is deposited in the same chamber as the subsequent etch operation to form the deep silicon trench in substrate 116 as will be described in more detail below.

Still referring to FIG. 2, it should be appreciated that sacrificial layer 118 may be composed of an organic material or an inorganic oxide material. An organic material may be deposited by fluorocarbon or hydrofluorocarbon gas chemistry, e.g., $C_xF_y$ or $C_xH_yF_z$ where x, y, and z can be any non-negative integer including zero. Of course, to optimize the deposition of sacrificial layer 118, the aforementioned gases may be mixed with other common gases such as hydrogen, argon, helium, carbon monoxide, and carbon dioxide. In another embodiment, sacrificial layer 118 may be deposited by a silicon containing gas chemistry, reacting with oxygen gas over the wafer surface. In this embodiment, an inorganic oxide material, i.e., silicon dioxide, will be formed as the sacrificial layer. Due to the compatibility of the conditions required for deposition of sacrificial layer 118, photoresist layer 110 may be removed prior to depositing the sacrificial layer. That is, photoresist layer 110 may be stripped prior to deposition of sacrificial layer 118, as the photoresist layer is optional. For example, when sacrificial layer 118 is an oxide layer, i.e., silicon dioxide, it is likely that photoresist layer 110 will be removed prior to the deposition of the sacrificial layer. It should be appreciated that after the deposition of sacrificial layer 118 on the inner surfaces of opening 120, which includes the vertical and horizontal surfaces within the opening, the mask will need to be reopened using a dry etch tool. That is, the horizontal surface of opening 120, which has been covered by sacrificial layer 118 will have to be reopened in order to etch a trench into substrate 116.

Figure 3:
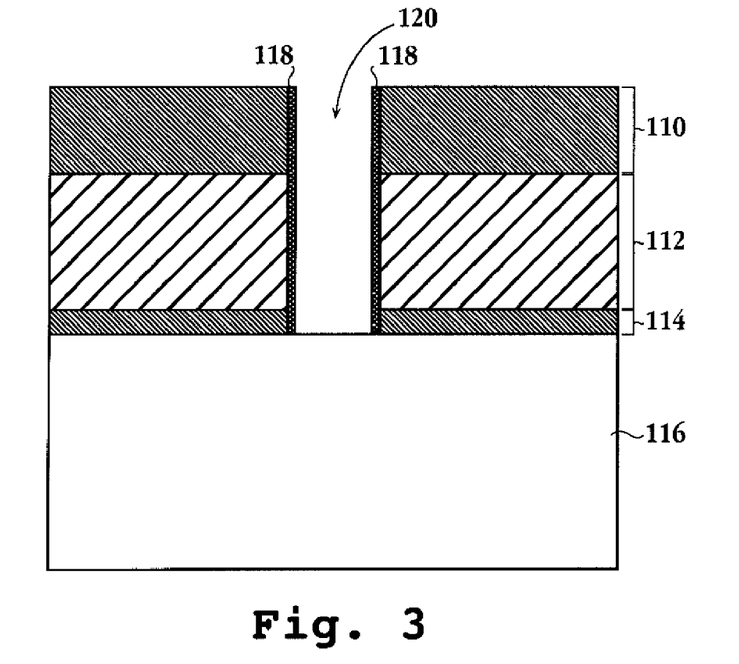
FIG. 3 is a simplified schematic diagram illustrating a cross-sectional view of the substrate and corresponding stack layers where the hard mask opening has been re-opened after the formation of a sacrificial layer in accordance with one embodiment of the invention.

FIG. 3 is a simplified schematic diagram illustrating a cross-sectional view of the substrate and corresponding stack layers where the hard mask opening has been reopened after the formation of a sacrificial layer in accordance with one embodiment of the invention. In one embodiment, a dry etch operation on sacrificial layer 118 removed the portion of the sacrificial layer disposed over the horizontal surfaces defined over photoresist 110 and substrate 116. However, the portion of sacrificial layer 118 disposed on the vertical surfaces within opening 120 remains intact. As illustrated in FIG. 3, the horizontal surfaces over photoresist layer 110 and silicon substrate 116 (at the bottom of opening 120) are free from sacrificial layer 118. However, vertical portions of sacrificial layer 118 remain within opening 120. In one embodiment, the thickness of sacrificial layer 118 is between about several nanometers to several hundred Angstroms.

Figure 4:
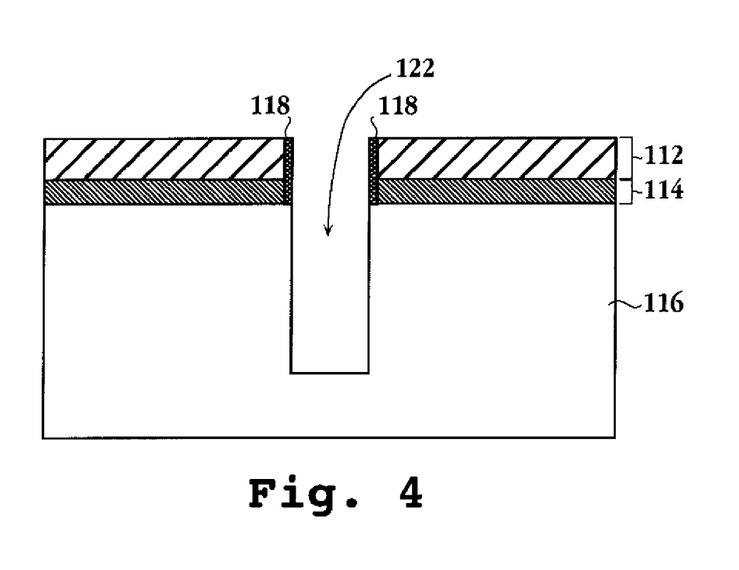
FIG. 4 is a simplified schematic diagram illustrating a cross-sectional view of a deep silicon trench etch performed on the substrate of FIG. 3 in accordance with one embodiment of the invention.

FIG. 4 is a simplified schematic diagram illustrating a cross-sectional view of a deep silicon trench etch performed on the substrate of FIG. 3 in accordance with one embodiment of the invention. Here, hard mask layers 114 and 112 remain after the etch operation to form deep silicon trench 122. As illustrated, protection layers 118 on the vertical surfaces of the hard mask opening protect silicon nitride layer 114 from lateral etching, as the etch progresses vertically much faster as compared to the lateral etch since there is relatively little ion bombardment against the sidewalls. Silicon substrate 116 is etched to define deep trench 122 with sacrificial layer 118 preventing both ions and radicals from chemically etching silicon nitride layer 114 or any other suitable layer that performs the function of the silicon nitride layer. As a consequence, there are no voids formed for the subsequent gap filling of deep silicon trench 122.

Figure 5:
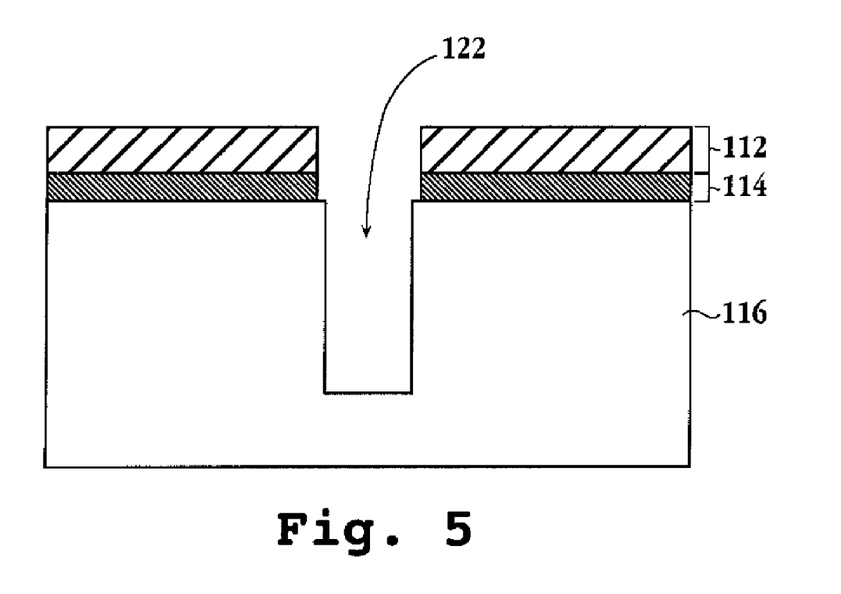
FIG. 5 is a simplified schematic diagram illustrating a cross-sectional view of a deep silicon trench having the vertical portion of the sacrificial layer removed in accordance with one embodiment of the invention.

FIG. 5 is a simplified schematic diagram illustrating a cross-sectional view of a deep silicon trench having the vertical portion of the sacrificial layer removed in accordance with one embodiment of the invention. In FIG. 5 it should be appreciated that any remaining portions of sacrificial layer 118 have been removed for a subsequent gap fill operation to take place. One skilled in the art will appreciate that the removal of a carbon based sacrificial layer may be achieved through application of an oxygen plasma. It should be appreciated that a planarization may be performed in order to remove layers 112 and 114 to provide a trench outline that does not have the "nail head" or "wine glass" outline. In one embodiment, deep silicon trench etch 122 is filled with a conductive metal. In an alternative embodiment, the vertical portions of sacrificial layer 118 remaining after the deep silicon trench etch of FIG. 4 are not removed. In this embodiment, the gap fill operation would occur on the trench illustrated in FIG. 4. Thus, removal of the vertical portions of sacrificial layer 118 of FIG. 5 is optional. In yet another embodiment, an additional underlying layer disposed below substrate 116 may be etched. Here, the protective later may or may not be removed prior to performing the etch operation on the additional underlying layer.

Figure 6:
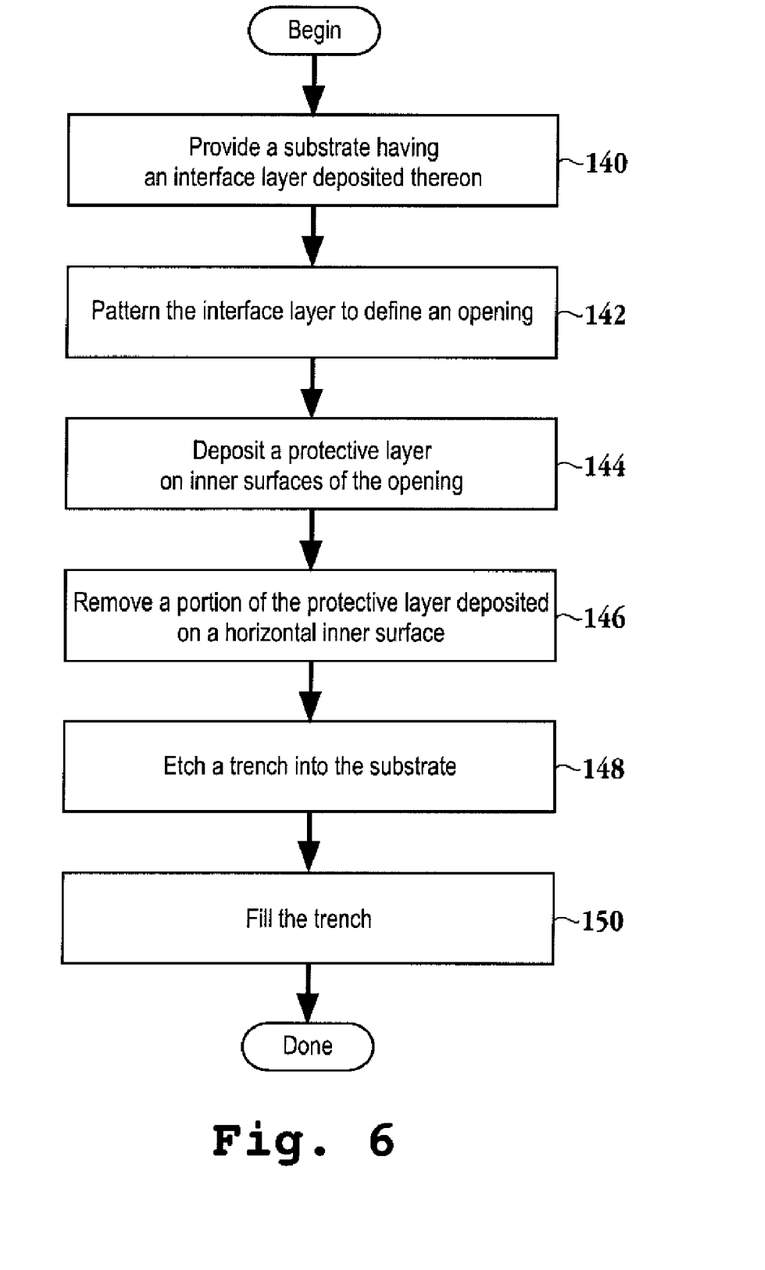
FIG. 6 is a flow chart diagram illustrating the method operations for performing an etch on a substrate in accordance with one embodiment of the invention.

FIG. 6 is a flow chart diagram illustrating the method operations for performing an etch on a substrate in accordance with one embodiment of the invention. The method initiates with operation 140 where a substrate having an interface layer deposited thereon is provided. For example, the interface layer may be a hard mask such as the hard mask illustrated with reference to FIGS. 1 through 5. In addition, the hard mask may have a photoresist layer deposited thereon. The method then proceeds to operation 142 where the interface layer is patterned to define an opening. Here, known semiconductor processing techniques may be used in order to define the pattern. As mentioned above, the pattern feature may proceed slightly into the substrate to guarantee protection of the thin layer disposed above the substrate from lateral etching. The method then proceeds to operation 144 where a protective layer is deposited on the inner surfaces of an opening defined within the hard mask. In one embodiment, the photoresist may be stripped prior to depositing the protective layer as discussed above. The protective layer, such as a sacrificial layer discussed with reference to FIGS. 1 through 5 may be deposited here. The protective layer may be an organic material, i.e., a carbon based material formed through a plasma of a gas mixture containing carbon, fluorine and/or hydrogen, or an inorganic oxide material, such as silicon dioxide, formed through a plasma of a silicon containing gas.

The method of FIG. 6 then moves to operation 146 where a portion of the protective layer deposited on the horizontal inner surfaces of the opening is removed to expose a portion of the substrate. The protective layer may be opened through an etch operation where vertical portions of the protective layer within the opening remain as discussed above. Then, the method advances to operation 148 where a trench is etched into the substrate. It should be appreciated that known etching techniques may be used to etch the trench and this etch may be a continuation of the etch operation that removed the portion of the protective layer in operation 146. In one embodiment, the deposition and etching discussed in operations 144–148 may be performed through a gas modulation technique as described with reference to FIG. 7. Subsequently, the trench that has been etched into the substrate is filled in operation 150. In one embodiment, the sidewall protective layer is removed prior to filling the trench. One skilled in the art will appreciate that this removal may be performed through a stripping process.

Figure 7:
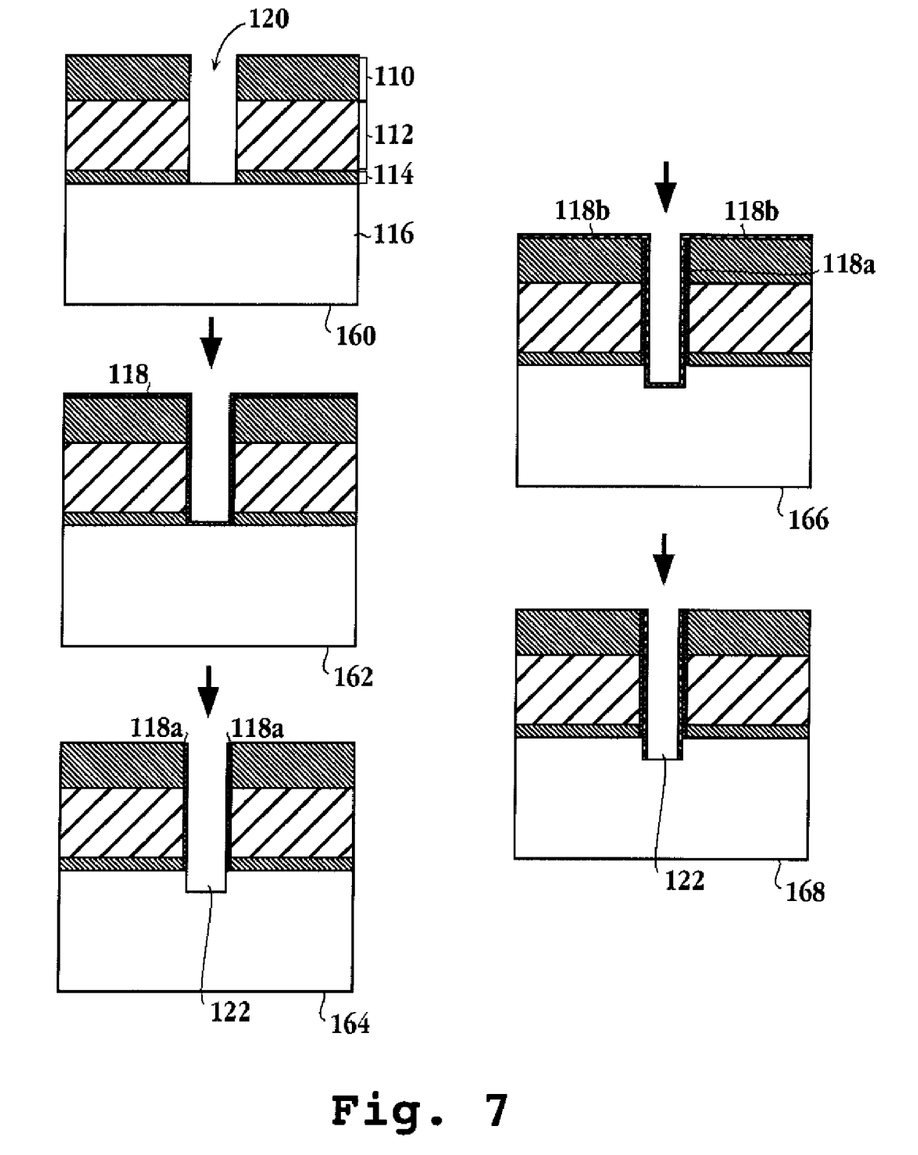
FIG. 7 is a simplified schematic diagram illustrating the successive operations of etching a trench within a silicon substrate utilizing a gas modulation technique in accordance with one embodiment of the invention.

FIG. 7 is a simplified schematic diagram illustrating the successive operation of etching a trench within a silicon substrate utilizing a gas modulation technique in accordance with one embodiment of the invention. Cross-section 160 of substrate 116 and its corresponding stack illustrates layers 110, 112, and 114 as represented in FIG. 1. In cross-section 162, sacrificial layer 118 is deposited over the inner surfaces of opening 120. As mentioned above with reference to FIG. 2, sacrificial layer 118 may be deposited through a conventional chemical vapor deposition technique. Additionally, the composition of sacrificial layer 118 may be a carbon based organic material or an oxide layer such as silicon dioxide. Then, in cross-section view 164 an etch operation is performed to remove sacrificial layer 118 on horizontal surfaces, as well as to begin to form deep trench 122 within the substrate. It should be appreciated that within the same chamber a gas modulation technique may be used where deposition gases are introduced for a specific time period in order to form sacrificial layer 118. Upon expiration of the specific time period, the gases being introduced into the chamber will switch to etch gases in order to begin the etching process as illustrated in cross-section view 164. The etching process will also proceed for a specified time period and then the deposition gases will be re-introduced in order to form a sacrificial layer 118b, illustrated in cross-section view 166. In cross-section view 166, sacrificial layer 118b is deposited along the inner surfaces of opening 120 and the newly formed portion of deep trench etch 122. After the specified time period is expired, the deposition gases are discontinued and etch gases are again introduced into the chamber in order to etch the sacrificial layer from horizontal surfaces and continue to form deep trench 122. As illustrated in cross-sectional view 168, the deep trench etch is incrementally defined through this modulation technique. The modulation technique will continue until an endpoint is reached. The endpoint may be detected through known techniques, e.g., optical spectrometry. In one embodiment, this modulation technique can repeat numerous times in order to ultimately define the deep trench.

Figure 8:
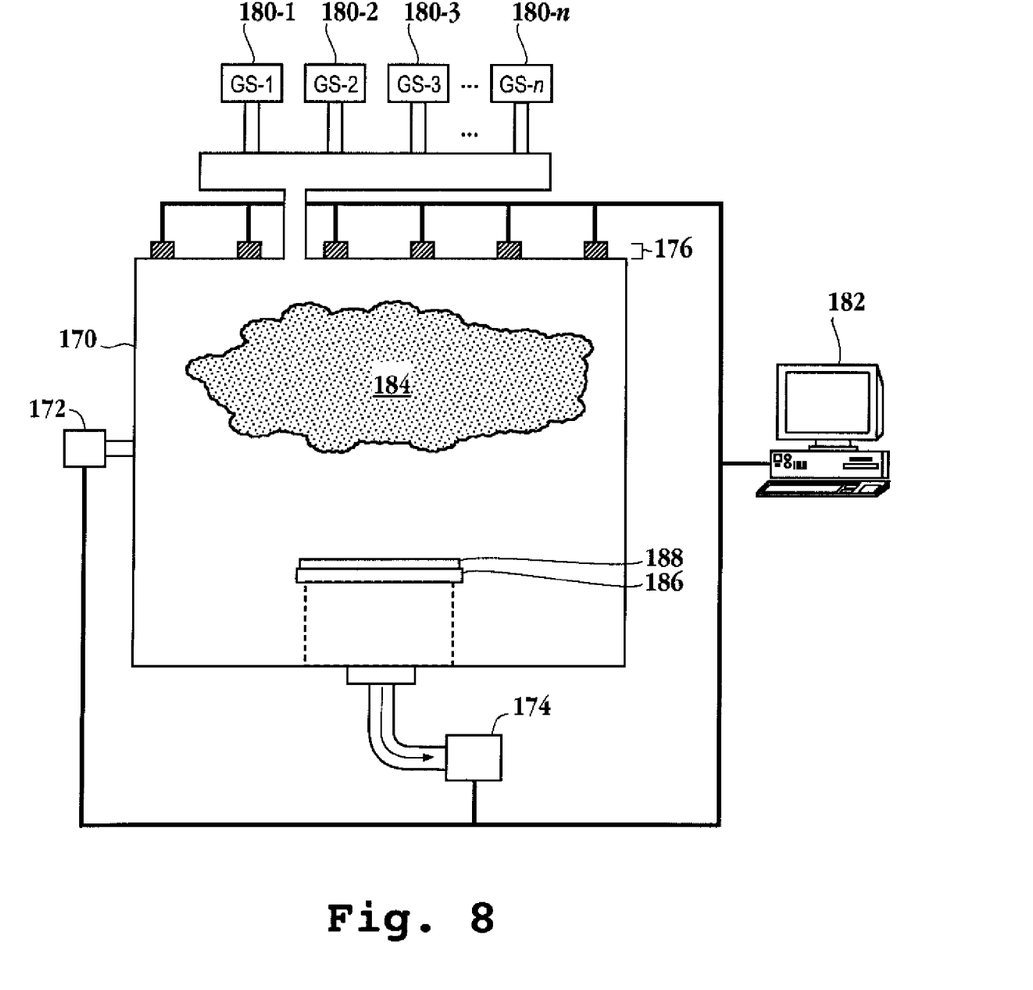
FIG. 8 is a simplified schematic diagram illustrating a processing chamber in which the gas modulation technique may be used in order to define the deep silicon trench in accordance with one embodiment of the invention.

FIG. 8 is a simplified schematic diagram illustrating a processing chamber in which the gas modulation technique may be used in order to define the deep silicon trench in accordance with one embodiment of the invention. Processing chamber 170 includes optical spectrometer 172, evacuation pump 174, and radio frequency (RF) coils 176. Manifold 178, which is in flow communication with gas supplies 180-1 through 180-n, is used to provide the introduction of process gases into processing chamber 170. The process gases, in conjunction with RF coils 176, form plasma 184, which is used to either deposit the sacrificial layer or etch the trench as discussed above. As illustrated, substrate 188 is supported on substrate support 186 within processing chamber 170. Controller 182, which may be a general computing device, is used to control the operation of processing chamber 170. That is, controller 182 will control the introduction of gases into processing chamber 170 in order to perform the gas modulation technique described above. In one embodiment, controller 182 may manipulate valves enabling the introduction of the deposition-based gases for a specified time period, e.g., for about 3 seconds. Upon expiration of the specified time period, controller 182 will shut the valves enabling the introduction of the deposition based gases and open valves introducing etch-based gases into the processing chamber for another specified time period, e.g., for about 1 second. Alternatively, upon expiration of the specified time period, the valves may be switched by the controller so that gases are either flowing to the process chamber or to a pump. It should be appreciated that the time periods mentioned above are exemplary and not meant to be limiting. In one embodiment, the specified time periods may range anywhere between 0.5 seconds and 20 seconds. Optical emission spectrometer (OES) 172 can be used to identify an endpoint during the deep silicon trench etch. Of course, one skilled in the art will appreciate that interferometry techniques, e.g., with a laser interferometer, may be used in place of OES technique. Evacuation pump 174 may be used to evacuate the chamber contents between operations, such as between the introduction of the etch and deposition based gases in one embodiment of the invention.

In one alternative embodiment, the operations described herein may be performed in more than one chamber. For example, the hard mask may be formed in a capacitively coupled dual or multi-frequency chamber, e.g., an EXELAN™ or similar chamber available from the assignee, while the deposition of the sacrificial layer, e.g., a silicon dioxide layer, is performed in an inductively coupled plasma etcher, such as the VERSYS™ chamber available form the assignee. The silicon trench etch may then be performed using the EXELAN™ chamber. In another alternative, the hard mask and the sacrificial layer may be formed in an EXELAN™ chamber available from the assignee. In this embodiment, a carbon based sacrificial layer is used. Exemplary gases used to form the carbon based sacrificial layer includes ethylene ($C_2H_4$), fluoromethylene ($CH_3F$) and hydrogen, and carbon monoxide (CO), or some other combination of carbon, fluorine, and/or hydrogen. Of course, a silicon dioxide sacrificial layer may be deposited through the use of a suitable gas containing silicon and oxygen gas. It should be noted that the embodiments described herein are not limited to the above-mentioned chambers. That is, the techniques discussed herein may be applied to any suitable processing chamber irrespective of whether the processing chamber is capable of performing the etch and the deposition processes successively in the same chamber or in external chambers.

In summary, the above-described embodiments provide a method and apparatus for preventing a lateral attack of a thin layer deposited over a substrate being etched. The thin layer may function as a stop layer or for stress relief in one embodiment of the invention. Additionally, a gas modulation technique enables the deposition and etching processes to occur within the same processing chamber, as well as alternate between deposition of the protective layer and etching the trench, thereby refreshing the protective layer and incrementally etching the trench. It should be appreciated that the embodiments described may be applied to Micro-electro-mechanical-systems (MEMS), e.g., where the deep silicon trench may be used a as a contact or for future alignment purposes, as well as other suitable semiconductor manufacturing processes and technologies.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims. In the claims, elements and/or steps do not imply any particular order of operation, unless explicitly stated in the claims.

What is claimed is:

1. A method for performing an etch on a substrate, comprising method operations of:
    providing a substrate having an interface layer deposited thereon;
    patterning the interface layer to define an opening;
    depositing a protective layer on inner surfaces of the opening;
    removing a portion of the protective layer deposited on a horizontal inner surface;
    partially etching a trench into the substrate;
    re-depositing the protective layer;
    continuing to alternate between partially etching the trench and re-depositing the protective layer until an end point is reached; and
    filling the trench.

2. The method of claim 1, wherein the interface layer is a hardmask.

3. The method of claim 1, further comprising:
    forming a photoresist layer over the hardmask; and
    removing any residual component of the protective layer prior to filling the trench.

4. The method of claim 1, wherein each of the method operations are performed within a single chamber.

5. The method of claim 1, wherein the method operation of depositing a protective layer on inner surfaces of the opening includes,
    introducing a silicon containing gas; and
    forming a silicon dioxide layer as the protective layer from a plasma generated from the silicon containing gas.

6. The method of claim 1, wherein the interface layer includes a silicon dioxide layer disposed over a silicon nitride layer.

7. The method of claim 1, wherein the protective layer is a carbon based film.

8. A method for etching a trench, comprising method operations of:
    providing a substrate having a patterned feature;
    alternating between deposition of a protective layer onto inner surfaces of the patterned feature and etching the trench into the substrate;
    continuing the alternating until the trench is completed; and
    filling the trench.

9. The method of claim 8, wherein the method operation of alternating between deposition of a protective layer onto inner surfaces of the patterned feature and etching the trench into the substrate includes,
    introducing a deposition based gas composition for a first time period into a chamber containing the substrate; and
    introducing an etch based gas composition for a second time period upon expiration of the first time period.

10. The method of claim 9, wherein the first time period can range from about 0.1 to 20 seconds and the second time period can range from about 0.1 to 20 seconds.

11. The method of claim 8, wherein each of the method operations is performed without transferring the substrate to a different processing chamber.

12. The method of claim 8, wherein the patterned feature is a deep substrate contact.

13. The method of claim 8, further comprising:
    removing remaining portions of the protective layer prior to filling the trench.

14. The method of claim 8, wherein the method operation of alternating between deposition of a protective layer onto inner surfaces of the patterned feature and etching the trench into the substrate includes,
    depositing an inorganic based protective layer; and
    etching the trench and horizontal portions of the inorganic based protective layer, wherein the depositing and the etching occur within a same chamber.

15. The method of claim 8, wherein the method operation of filling the trench includes,
    filling over remaining vertical portions of the protective layer.

* * * * *